US012784841B2

(12) United States Patent
Ito et al.

(10) Patent No.: US 12,784,841 B2
(45) Date of Patent: Nov. 3, 2026

(54) POWER SUPPLY APPARATUS AND MEMORY SYSTEM

(71) Applicant: TDK Corporation, Tokyo (JP)

(72) Inventors: Yugi Ito, Tokyo (JP); Norikazu Okako, Tokyo (JP); Yuki Tada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 155 days.

(21) Appl. No.: 19/008,870

(22) Filed: Jan. 3, 2025

(65) Prior Publication Data

US 2025/0246250 A1 Jul. 31, 2025

(30) Foreign Application Priority Data

Jan. 29, 2024 (JP) ................................ 2024-010833
Dec. 25, 2024 (JP) ................................ 2024-228275

(51) Int. Cl.
*G11C 16/04* (2006.01)
*G11C 16/30* (2006.01)
*H02M 3/158* (2006.01)

(52) U.S. Cl.
CPC ............ *G11C 16/30* (2013.01); *H02M 3/158* (2013.01)

(58) Field of Classification Search
CPC ....... G11C 16/30; H02M 3/158; H02M 1/008; H02M 3/156
USPC .................................................... 365/185.18
See application file for complete search history.

(56) References Cited

U.S. PATENT DOCUMENTS

| | | | | |
|---|---|---|---|---|
| 7,366,019 B2 * | 4/2008 | Kubo | ..................... | G11C 5/147 365/189.09 |
| 11,302,401 B2 * | 4/2022 | Okako | ................... | G11C 16/10 |
| 11,404,906 B1 * | 8/2022 | Wang | ...................... | G06F 1/263 |

FOREIGN PATENT DOCUMENTS

JP 6384306 B2 9/2018

* cited by examiner

*Primary Examiner* — Tha-O H Bui
(74) *Attorney, Agent, or Firm* — Oliff PLC

(57) ABSTRACT

A power supply apparatus includes: a power supply terminal receiving an input voltage from outside; first and second step-down circuits respectively generating first and second output voltages to be supplied to a memory device; first and second coupling lines coupling the power supply terminal and the first and second step-down circuits, respectively; a step-up circuit disposed on the first coupling line at a location between the power supply terminal and the first step-down circuit, and stepping up the input voltage; a switching device disposed on the first coupling line at a location between the step-up circuit and the first step-down circuit; a capacitor disposed on the first coupling line at a location between the switching device and the first step-down circuit; and a first reverse-flow prevention diode disposed on the second coupling line at a location between the power supply terminal and the second step-down circuit.

10 Claims, 12 Drawing Sheets

POWER SUPPLY APPARATUS AND MEMORY SYSTEM

CROSS-REFERENCE TO RELATED APPLICATIONS

The present application claims priority from Japanese Patent Application No. 2024-010833 filed on Jan. 29, 2024 and Japanese Patent Application No. 2024-228275 filed on Dec. 25, 2024, the entire contents of each of which are hereby incorporated by reference.

BACKGROUND

The disclosure relates to a power supply apparatus configured to generate a voltage to be supplied to a memory device, and a memory system including the power supply apparatus and the memory device.

Various memory systems have been proposed that each include a power supply apparatus and a memory device such as a flash memory. For example, reference is made to Japanese Patent No. 6384306.

SUMMARY

A power supply apparatus according to one embodiment of the disclosure is configured to generate a voltage to be supplied to a memory device. The power supply apparatus includes a power supply terminal, a first step-down circuit, a second step-down circuit, a first coupling line, a second coupling line, a step-up circuit, a switching device, a capacitor, and a first reverse-flow prevention diode. The power supply terminal is configured to receive an input voltage from outside. The first step-down circuit is configured to generate a first output voltage to be supplied to the memory device. The second step-down circuit is configured to generate a second output voltage to be supplied to the memory device. The first coupling line couples the power supply terminal and the first step-down circuit to each other. The second coupling line couples the power supply terminal and the second step-down circuit to each other. The step-up circuit is disposed on the first coupling line at a location between the power supply terminal and the first step-down circuit, and is configured to step up the input voltage supplied from the power supply terminal. The switching device is disposed on the first coupling line at a location between the step-up circuit and the first step-down circuit. The capacitor is disposed on the first coupling line at a location between the switching device and the first step-down circuit. The first reverse-flow prevention diode is disposed on the second coupling line at a location between the power supply terminal and the second step-down circuit.

A memory system according to one embodiment of the disclosure includes a power supply apparatus and a memory device. The power supply apparatus is configured to generate a voltage to be supplied to the memory device. The power supply apparatus includes a power supply terminal, a first step-down circuit, a second step-down circuit, a first coupling line, a second coupling line, a step-up circuit, a switching device, a capacitor, and a first reverse-flow prevention diode. The power supply terminal is configured to receive an input voltage from outside. The first step-down circuit is configured to generate a first output voltage to be supplied to the memory device. The second step-down circuit is configured to generate a second output voltage to be supplied to the memory device. The first coupling line couples the power supply terminal and the first step-down circuit to each other. The second coupling line couples the power supply terminal and the second step-down circuit to each other. The step-up circuit is disposed on the first coupling line at a location between the power supply terminal and the first step-down circuit, and is configured to step up the input voltage supplied from the power supply terminal. The switching device is disposed on the first coupling line at a location between the step-up circuit and the first step-down circuit. The capacitor is disposed on the first coupling line at a location between the switching device and the first step-down circuit. The first reverse-flow prevention diode is disposed on the second coupling line at a location between the power supply terminal and the second step-down circuit.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
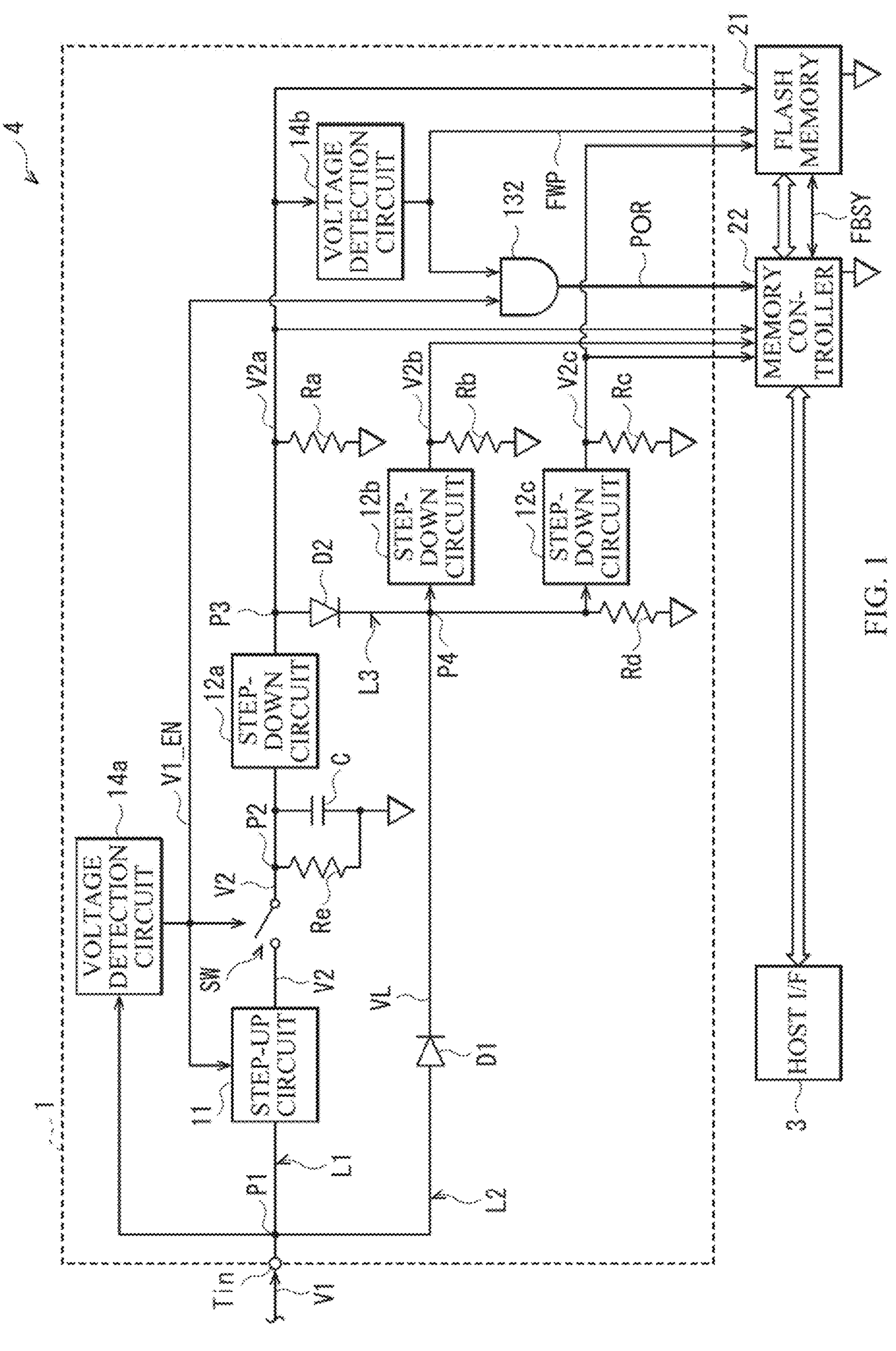
FIG. 1 is a circuit diagram illustrating a schematic configuration example of a memory system according to one example embodiment of the disclosure.

Reduced power consumption is demanded of a system such as a memory system that includes a memory device and a power supply apparatus.

It is desirable to provide a power supply apparatus that makes it possible to reduce power consumption, and a memory system including such a power supply apparatus.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings. Note that the description is given in the following order.

1. Example Embodiment: an example of application to a memory system including a flash memory and a power supply apparatus
2. Modification Examples
   Modification Example 1: an example case of aligning supply timings of output voltages
   Modification Example 2: an example case with a modification made to a circuit configuration of the power supply apparatus
3. Other Modification Examples

1. Example Embodiment

[Configuration]

FIG. 1 is a circuit diagram illustrating a schematic configuration example of a memory system 4 according to an example embodiment of the disclosure. The memory system 4 may be a system such as a flash memory system applicable to a memory device such as a flash memory device. Non-limiting examples of the memory device may include a flash memory 21 to be described later. As illustrated in FIG. 1, the memory system 4 may include a power supply apparatus 1, the flash memory 21, a memory controller 22, and a host interface (I/F) 3.

[Flash Memory 21, Etc.]

The flash memory 21 may be a nonvolatile memory in which data supplied from outside (i.e., from a host) via the host I/F 3 is to be stored, as indicated by arrows in FIG. 1. The host I/F 3 will be described later. The memory controller 22 may be a controller that performs operations including, as indicated by the arrows in FIG. 1, a write operation to write data supplied from the host via the host I/F 3 to the flash memory 21 and a read operation to read data stored in the flash memory 21.

The flash memory 21 may transmit to the memory controller 22 a signal FBSY that indicates whether the flash memory 21 is capable of accepting a command from the memory controller 22. For example, the signal FBSY being "H" (high) may indicate that the flash memory 21 is capable of accepting a command from the memory controller 22, that is, the flash memory 21 is accessible from the memory controller 22. In contrast, the signal FBSY being "L" (low) may indicate that the flash memory 21 is incapable of accepting a command from the memory controller 22, that is, the flash memory 21 is busy and thus inaccessible from the memory controller 22. The flash memory 21 is busy during a write period over which data received from the memory controller 22 is being written to a cell in the flash memory 21. If power-down occurs in the write period, that is, if a later-described voltage V1 supplied from outside falls below a predetermined threshold in the write period, there is a high possibility that the data in the flash memory 21 will be corrupted.

The flash memory 21 and the memory controller 22 may each correspond to a specific but non-limiting example of a "memory device" in one embodiment of the disclosure.

The host I/F 3 may be an interface for data transfer between the memory system 4 (the flash memory 21 and the memory controller 22) and the host. The host I/F 3 may be an interface for solid state drives (SSDs), for example. Non-limiting examples of such a host I/F 3 may include Serial Advanced Technology Attachment (SATA), Parallel Advanced Technology Attachment (PATA), and Peripheral Component Interconnect-Express (PCIe).

[Power Supply Apparatus 1]

The power supply apparatus 1 generates a voltage to be supplied to the memory device described above, that is, each of the flash memory 21 and the memory controller 22. The voltage may include voltages V2*a* to V2*c* to be described later. As illustrated in FIG. 1, the power supply apparatus 1 may include a power supply terminal Tin, coupling lines L1 to L3, a step-up circuit 11, a plurality of (e.g., three) step-down circuits 12*a* to 12*c*, a logical conjunction (AND) circuit 132, voltage detection circuits 14*a* and 14*b*, a switching device SW, a capacitor C, diodes D1 and D2, and dummy resistors Ra to Re.

The coupling line L1 may correspond to a specific but non-limiting example of a "first coupling line" in one embodiment of the disclosure. The coupling line L2 may correspond to a specific but non-limiting example of a "second coupling line" in one embodiment of the disclosure. The coupling line L3 may correspond to a specific but non-limiting example of a "third coupling line" in one embodiment of the disclosure. The step-down circuit 12*a* may correspond to a specific but non-limiting example of a "first step-down circuit" in one embodiment of the disclosure. The step-down circuits 12*b* and 12*c* may each correspond to a specific but non-limiting example of a "second step-down circuit" in one embodiment of the disclosure. The voltage detection circuit 14*a* may correspond to a specific but non-limiting example of a "voltage detection circuit" in one embodiment of the disclosure. The capacitor C may correspond to a specific but non-limiting example of a "capacitor" in one embodiment of the disclosure. The diode D1 may correspond to a specific but non-limiting example of a "first reverse-flow prevention diode" in one embodiment of the disclosure. The diode D2 may correspond to a specific but non-limiting example of a "second reverse-flow prevention diode" in one embodiment of the disclosure.

The power supply terminal Tin may be a terminal to receive the voltage V1 (i.e., a host supply voltage) from outside the memory system 4 (i.e., from the host), as illustrated in FIG. 1. The voltage V1 may be 3.3 V, for example.

The coupling line L1 couples the power supply terminal Tin and the step-down circuit 12*a* to each other. The coupling line L2 couples the power supply terminal Tin and each of the step-down circuits 12*b* and 12*c* to each other. The step-down circuits 12*a* to 12*c* will be described later. The coupling line L3 may couple an output side of the step-down circuit 12*a*, i.e., a node P3 in FIG. 1, and an input side of the step-down circuits 12*b* and 12*c*, i.e., a node P4 in FIG. 4, to each other. For example, as illustrated in FIG. 1, the coupling line L1 may be coupled to the step-down circuit 12*a* through a node P1, the step-up circuit 11, the switching device SW, and a node P2 in this order from the power supply terminal Tin. The coupling line L2 may be coupled to the step-down circuits 12*b* and 12*c* through the diode D1 and the node P4 in this order from the power supply terminal Tin. The coupling line L3 may be coupled to the node P4 through the diode D2 from the node P3.

The step-up circuit 11 is disposed on the coupling line L1 as described above, and lies at a location between the power supply terminal Tin and the step-down circuit 12*a*. The step-up circuit 11 may be a circuit that steps up the voltage V1 of, for example, 3.3 V supplied from the power supply terminal Tin and outputs a voltage V2 of, for example, 5 V as a step-up voltage. The voltage V2 may serve as a voltage for power backup in the event of power-down (i.e., a case where the voltage V1 falls below a predetermined threshold) to be described later, and may be stored as electric charge in the capacitor C to be described later.

As illustrated in FIG. 1, each of the step-down circuits 12*a* to 12*c* may be a circuit that steps down a voltage supplied through any one of the foregoing coupling lines L1 to L3 and thereby generates corresponding one of voltages V2*a* to V2*c* as a step-down voltage to be supplied to the memory controller 22 or to both the flash memory 21 and the memory controller 22. For example, the step-down circuit 12*a* may generate the voltage V2*a* by stepping down the voltage V2 (i.e., the step-up voltage outputted from the step-up circuit 11) supplied through the coupling line L1 and supply the voltage V2*a* to each of the flash memory 21 and the memory controller 22. The step-down circuit 12*b* may generate the voltage V2*b* by stepping down a voltage supplied through the coupling line L2 or L3 and supply the voltage V2*b* to the memory controller 22. The step-down circuit 12*c* may generate the voltage V2*c* by stepping down the voltage supplied through the coupling line L2 or L3 and supply the voltage V2*c* to each of the flash memory 21 and the memory controller 22.

In this way, in the example embodiment, the voltages V2*a* to V2*c* outputted from the multiple step-down circuits 12*a* to 12*c* may have respective different voltage values appropriate to the memory device (i.e., each of the flash memory 21 and the memory controller 22). For example, in the example embodiment illustrated in FIG. 1, the respective values of the voltages V2*a* to V2*c* may satisfy the following magnitude relationship: V2*a*≥V2*b*≥V2*c*. Further, FIG. 3 to be described later illustrates an example in which the voltages V2*b* and V2*c* respectively outputted from the step-down circuits 12*b* and 12*c* may each be lower than the voltage V2*a* outputted from the step-down circuit 12*a* (i.e., V2*b*<V2*a* and V2*c*<V2*a*).

The voltage V1 described above may correspond to a specific but non-limiting example of an "input voltage" in one embodiment of the disclosure. The voltage V2*a* may correspond to a specific but non-limiting example of a "first output voltage" in one embodiment of the disclosure. The voltages V2*b* and V2*c* may each correspond to a specific but non-limiting example of a "second output voltage" in one embodiment of the disclosure.

The voltage detection circuit 14*a* may be a circuit that detects the voltage V1 supplied from the power supply terminal Tin through the node P1, as illustrated in FIG. 1. As will be described in detail later, the voltage detection circuit 14*a* may output a signal V1_EN that is "L" or "H" depending on a magnitude of the voltage V1 having been detected, that is, depending on a magnitude relationship between the voltage V1 and a predetermined threshold voltage Vth. When the signal V1_EN is "L", the switching device SW to be described later may be set to an off-state (i.e., a blocking state) and the step-up circuit 11 may be set to a stopped state. In contrast, when the signal V1_EN is "H", the switching device SW may be set to an on-state and the step-up circuit 11 may be set to an operating state. Switching the switching device SW between the on-state and the off-state in such a manner allows for controlling a supply path for electric power in the power supply apparatus 1. The supply path for the electric power may include power supply routes Rp1 to Rp3 to be described later.

The voltage detection circuit 14*b* may be a circuit that detects the voltage V2*a* outputted from the step-down circuit 12*a*, as illustrated in FIG. 1. The voltage detection circuit 14*b* may output a signal FWP that is "L" or "H" depending on the magnitude of the voltage V2*a* having been detected. When the signal FWP is "L", the write operation to write data to the flash memory 21 may be disabled. When the signal FWP is "H", the write operation to write data to the flash memory 21 is enabled, that is, the disabling of the write operation may be canceled.

The AND circuit 132 may be a circuit that outputs a signal POR to the memory controller 22, as illustrated in FIG. 1. The signal POR may be a logical conjunction (AND) of the signal V1_EN outputted from the voltage detection circuit 14*a* and the signal FWP outputted from the voltage detection circuit 14*b*. When the signal POR is "L", the operations of the memory controller 22 may be stopped. When the signal POR is "H", the operations of the memory controller 22 may be enabled, that is, the stopping of the operations of the memory controller 22 may be canceled.

The switching device SW is disposed on the coupling line L1 at a location between the step-up circuit 11 and the step-down circuit 12*a*, that is, between the step-up circuit 11 and the node P2, as illustrated in FIG. 1. The switching device SW may be set to the on-state or the off-state in accordance with the signal V1_EN outputted from the voltage detection circuit 14*a*.

The switching device SW may include a switching device having a capability of preventing a reverse flow.

The capacitor C may be a large-capacitance capacitor disposed on the coupling line L1 at a location between the switching device SW and the step-down circuit 12*a*, as illustrated in FIG. 1. For example, the capacitor C may have a fist end coupled to the node P2 and a second end coupled to a ground. The capacitor C may serve as a backup capacitor adapted to supply electric charge to the flash memory 21 and the memory controller 22 during power-down (i.e., when the voltage V1 falls below the predetermined threshold) to be described later. As will be described in detail later, in the event of the power-down, the electric charge is supplied from the capacitor C to the step-down circuits 12*a* to 12*c*, which secures power supply to the flash memory 21 when the flash memory 21 is busy. This helps to prevent data in the flash memory 21 from being corrupted.

The diodes D1 and D2 may each serve as a reverse-flow prevention diode adapted to prevent a reverse flow of electric charge, and may each include, for example, a Schottky diode or an ideal diode. The diode D1 is disposed on the coupling line L2 at a location between the power supply terminal Tin and the step-down circuits 12*b* and 12*c*, that is, between the node P1 and the node P4, as illustrated in FIG. 1. For example, on the coupling line L2, an anode of the diode D1 may be positioned closer to the node P1 and a cathode of the diode D1 may be positioned closer to the node P4. The diode D2 may be disposed on the coupling line L3 at a location between the node P3 and the node P4. For example, on the coupling line L3, an anode of the diode D2 may be positioned closer to the node P3 and a cathode of the diode D2 may be positioned closer to the node P4.

The dummy resistors Ra to Re may each be a resistor for discharging surplus electric charge. As illustrated in FIG. 1, the dummy resistor Ra may be disposed between an output line of the voltage V2*a* from the step-down circuit 12*a* and the ground. Similarly, the dummy resistor Rb may be disposed between an output line of the voltage V2*b* from the step-down circuit 12*b* and the ground, and the dummy resistor Rc may be disposed between an output line of the voltage V2*c* from the step-down circuit 12*c* and the ground. The dummy resistor Rd may be disposed between an input line of the step-down circuits 12*b* and 12*c*, that is, the node P4, and the ground. The dummy resistor Re may be disposed parallel to the capacitor C at a location between the node P2 and the ground.

[Operations, Workings, and Example Effects]

Now, with reference to FIGS. 2 to 5 as well as FIG. 1, an operation example of the example embodiment, that is, an example of operations of the memory system 4 and the power supply apparatus 1 will be described in detail in comparison with a comparative example.

A. Comparative Example

Figure 2:
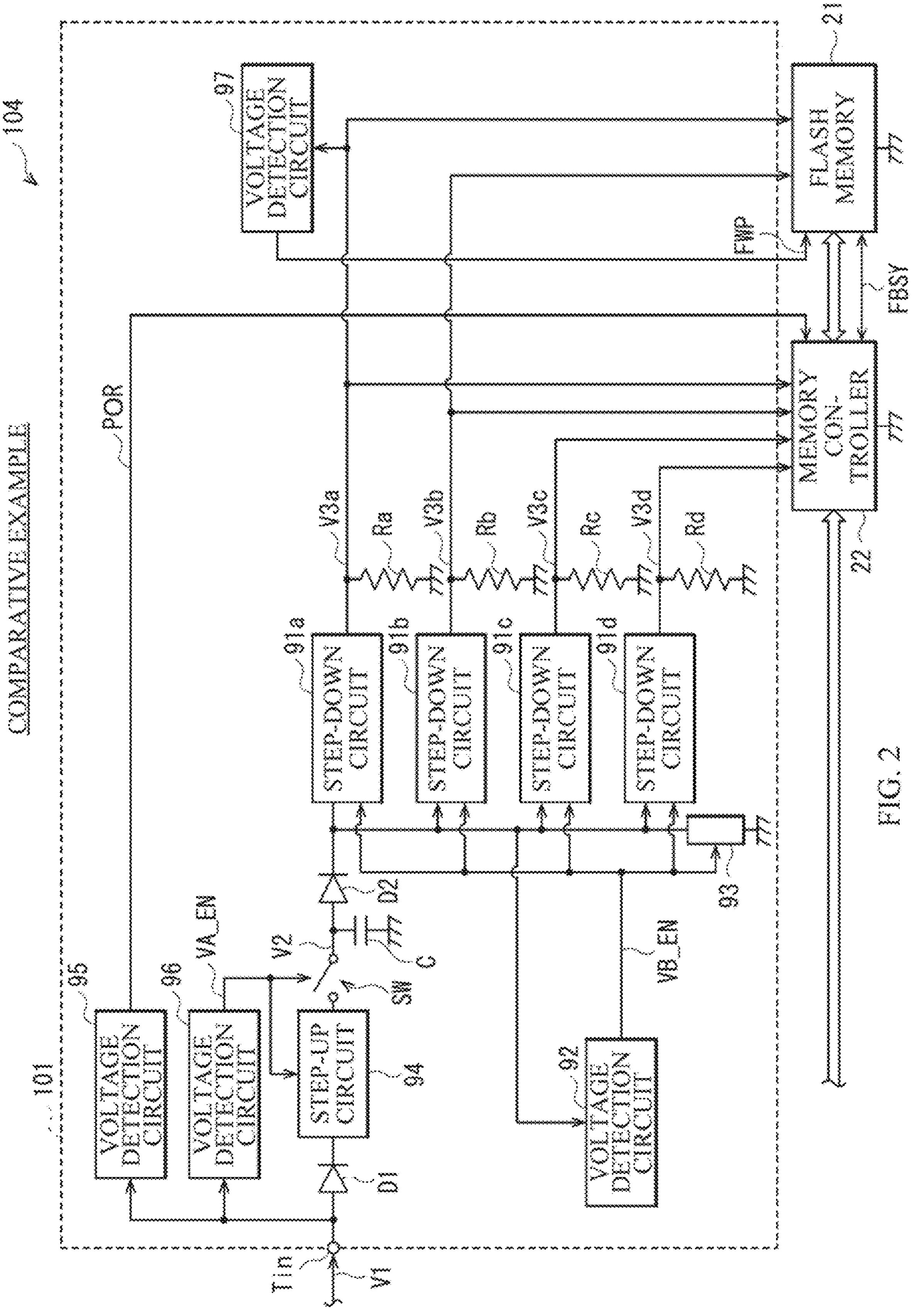
FIG. 2 is a circuit diagram illustrating a schematic configuration of a memory system according to a comparative example.

FIG. 2 is a circuit diagram illustrating a schematic configuration of a memory system 104 according to a comparative example. The memory system 104 of the comparative example corresponds to the memory system 4 of the example embodiment illustrated in FIG. 1 in which the power supply apparatus 1 is replaced with a power supply apparatus 101. As illustrated in FIG. 2, the power supply apparatus 101 of the comparative example may include the power supply terminal Tin, four step-down circuits 91*a* to 91*d*, a voltage detection circuit 92, a discharge circuit 93, a step-up circuit 94, voltage detection circuits 95 to 97, the switching device SW, the capacitor C, the diodes D1 and D2, and the dummy resistors Ra to Rd.

In the power supply apparatus 101, the voltage V1 received at the power supply terminal Tin may be detected by each of the voltage detection circuits 95 and 96, and the signal POR may be supplied from the voltage detection circuit 95 to the memory controller 22. Meanwhile, a signal VA_EN may be supplied from the voltage detection circuit 96 to each of the switching device SW and the step-up circuit 94 to thereby control the on- and off-states of the switching device SW and set the step-up circuit 94 to the operating state or the stopped state. Further, a voltage obtained from the power supply terminal Tin through the diode D1 may be stepped up by the step-up circuit 94. A step-up voltage (i.e., the voltage V2) outputted from the step-up circuit 94 through the switching device SW may be supplied to the capacitor C and supplied through the diode D2 to each of the discharge circuit 93 and the step-down circuits 91*a* to 91*d*. The voltage supplied to each of the step-down circuits 91*a* to 91*d* may be detected by the voltage detection circuit 92, and a signal VB_EN outputted from the voltage detection circuit 92 may be supplied to each of the discharge circuit 93 and the step-down circuits 91*a* to 91*d*. The step-down circuits 91*a*, 91*b*, 91*c*, and 91*d* may step down the supplied voltage and thereby output voltages V3*a*, V3*b*, V3*c*, and V3*d*, respectively. Each of these voltages V3*a*, V3*b*, V3*c*, and V3*d* may be supplied to the memory controller 22 or to both the flash memory 21 and the memory controller 22. The voltage V3*a* may be detected at the voltage detection circuit 97, and the signal FWP may be supplied to the flash memory 21. The dummy resistors Ra to Rd may each be disposed between an output line of corresponding one of the step-down circuits 91*a* to 91*d* and the ground.

In the power supply apparatus 101 having such a configuration, a voltage necessary at each of the flash memory 21 and the memory controller 22 may be generated at corresponding one or more of the step-down circuits 91*a* to 91*d*, based on the voltage V1 supplied from outside (i.e., from the host) to the power supply terminal Tin. Further, at the same time, the voltage V2 as the step-up voltage obtained by the step-up circuit 94 may be used to charge the capacitor C, as described above.

In the power supply apparatus 101, when a drop in the voltage V1 (i.e., the occurrence of power-down) is detected by the voltage detection circuits 95 and 96, the operations of the memory controller 22 may be stopped by the signal POR outputted from the voltage detection circuit 95. Further, when such a drop in the voltage V1 is detected, the signal VA_EN outputted from the voltage detection circuit 96 may cause the switching device SW to switch from the on-state to the off-state. This may cause the electric charge stored in the capacitor C (a large-capacitance capacitor) to be supplied to each of the step-down circuits 91*a* to 91*d* through the diode D2, thereby allowing a power supply voltage to be secured. In this way, the power supply voltage of each of the step-down circuits 91*a* to 91*d* is securable while the flash memory 21 is busy, that is, during a period of data writing to a cell. Thus, data under writing is securable even in the event of the power-down while the flash memory 21 is busy.

However, in the power supply apparatus 101 or the memory system 104 of the comparative example, as illustrated in FIG. 2, the step-up voltage from the step-up circuit 94 is to be supplied to all the four step-down circuits 91*a* to 91*d*. This places a large operational burden on the step-up circuit 94, and can thus result in increased power consumption.

B. Operation Example of Example Embodiment

In contrast, the memory system 4 of the example embodiment may perform, for example, the following operations with the circuit configuration illustrated in FIG. 1.

Figure 3:
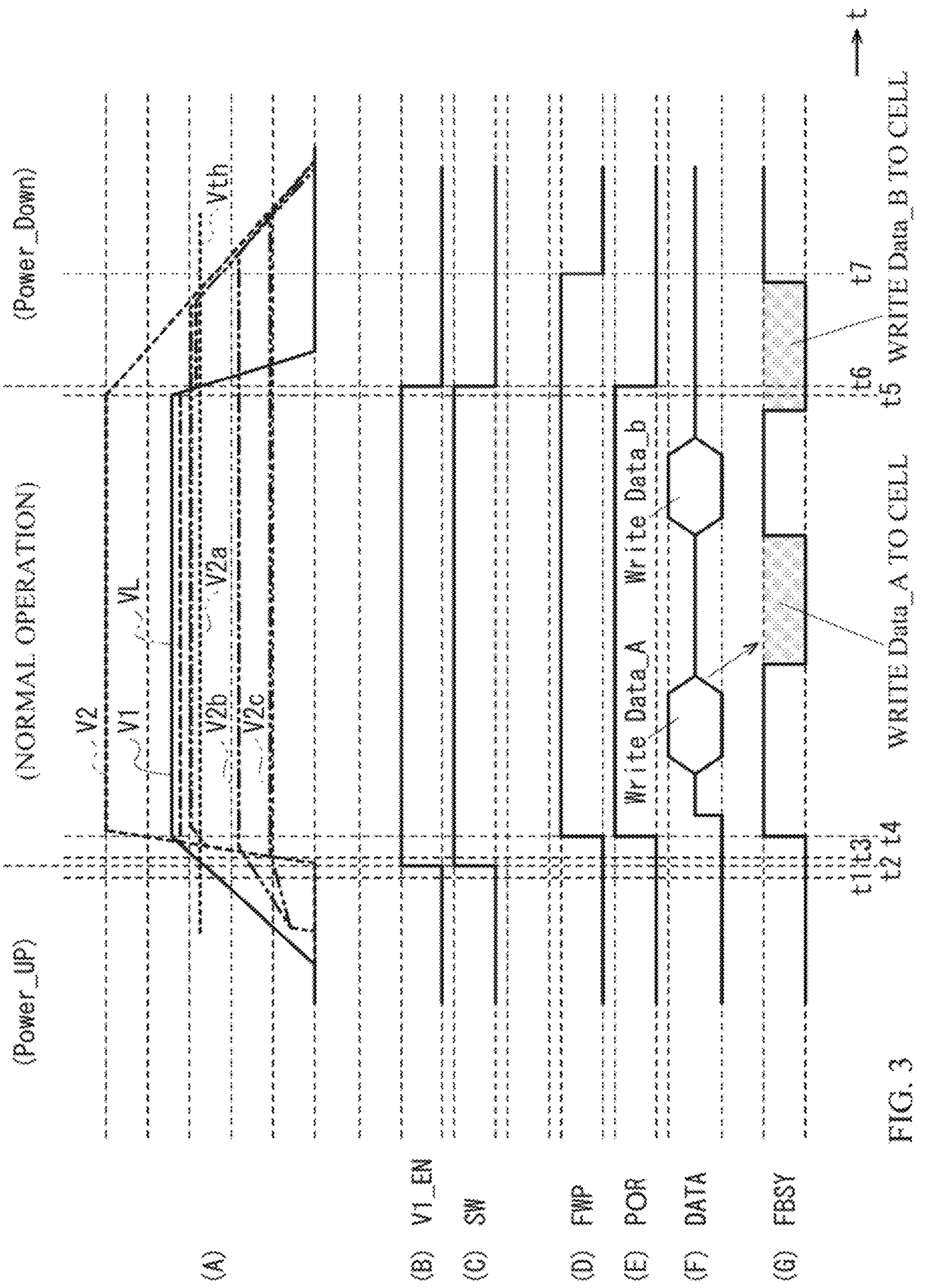
FIG. 3 is a timing diagram illustrating an operation example of the memory system illustrated in FIG. 1.

FIG. 3 is a timing diagram illustrating an operation example of the memory system 4 illustrated in FIG. 1, that is, an example of operations during a normal operation, during "Power_Down", and during "Power_Up" to be described later. For example, part (A) of FIG. 3 illustrates the foregoing voltages V1, V2, and V2*a* to V2*c*, and a later-described voltage VL together. Part (B) of FIG. 3 illustrates the foregoing signal V1_EN. Part (C) of FIG. 3 illustrates the on- and off-states of the switching device SW. Parts (D), (E), and (G) of FIG. 3 illustrate the foregoing signals FWP, POR, and FBSY, respectively. Part (F) of FIG. 3 illustrates data (DATA) supplied to the flash memory 21. In FIG. 3, the horizontal axis represents time t. Timings t1 to t7 along the time t are indicated in FIG. 3.

Figure 4:
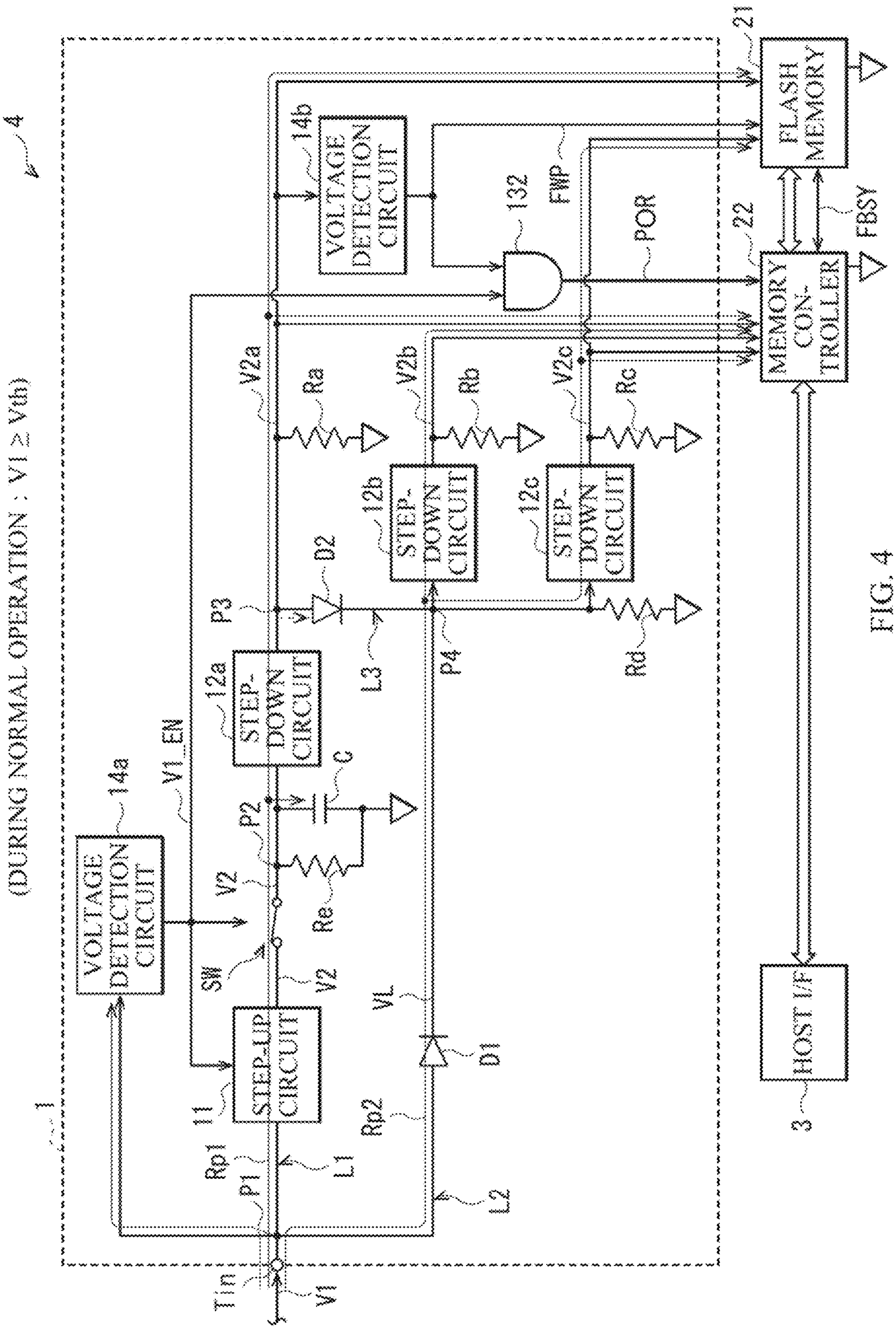
FIG. 4 is a circuit diagram illustrating an example of an operation state during normal operation in FIG. 3.
Figure 5:
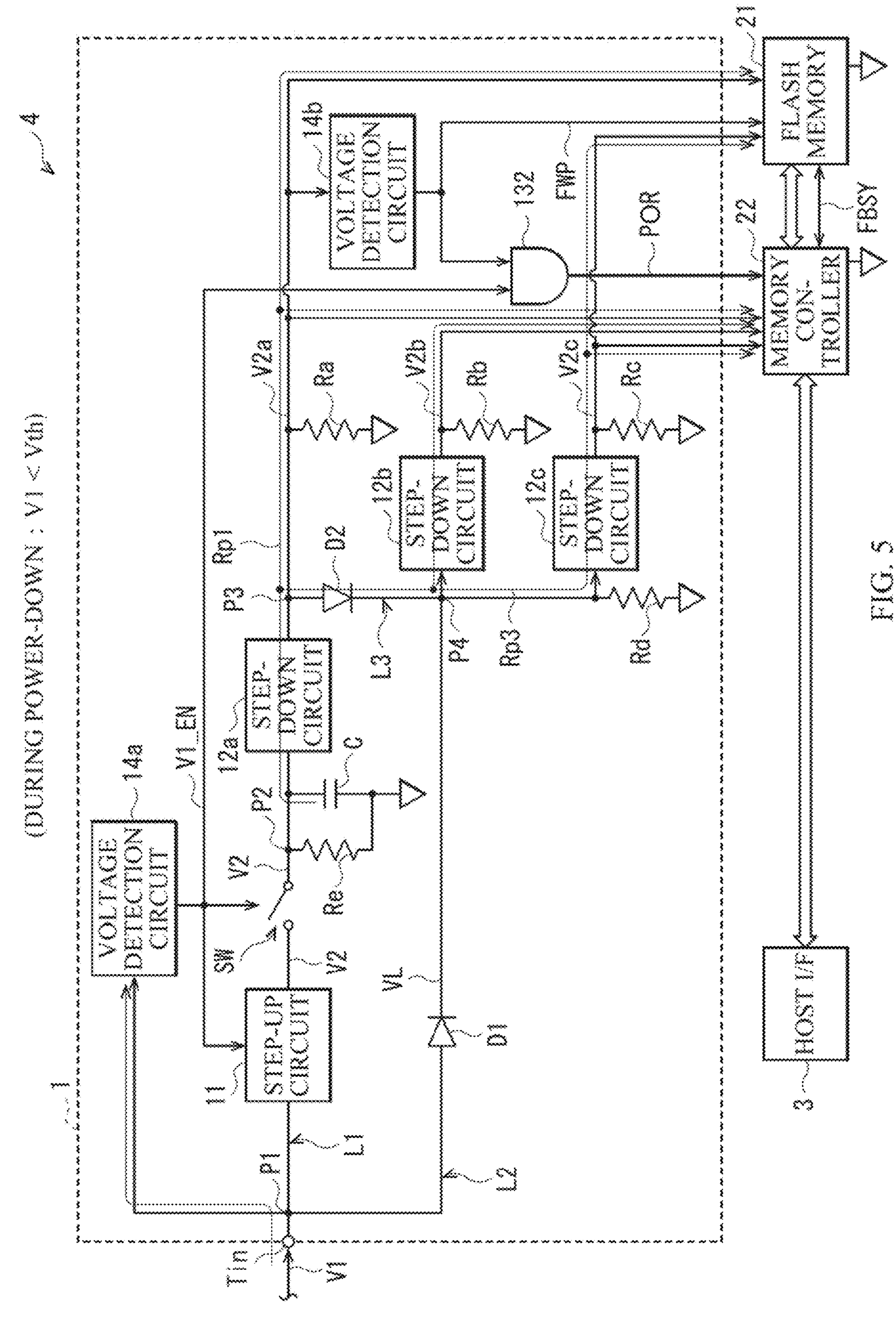
FIG. 5 is a circuit diagram illustrating an example of an operation state during power-down in FIG. 3.

FIG. 4 is a circuit diagram illustrating an example of an operation state during the normal operation in FIG. 3, that is, during a period from the timing t2 to the timing t6 in FIG. 3 in which the voltage V1 is higher than or equal to the threshold voltage Vth. FIG. 5 is a circuit diagram illustrating an example of an operation state during power-down ("Power_Down") in FIG. 3, that is, when the voltage V1 is lower than the threshold voltage Vth (i.e., a period after the timing t6 in FIG. 3). Note that a period from a start to the timing t2 may correspond to a "Power-Up" period in which the voltage V1 is lower than the threshold voltage Vth. In FIGS. 4 and 5, the power supply routes Rp1 to Rp3 described below are indicated by respective arrows.

[B-1. During Normal Operation]

During the normal operation illustrated in FIG. 3, the memory system 4 of the example embodiment may operate, for example, in a manner illustrated in FIG. 4.

For example, during the normal operation, the signal V1_EN is "H" because the voltage V1 received at the power supply terminal Tin is higher than or equal to the predetermined threshold voltage Vth (e.g., 2.7 V), that is, V1≥Vth, as illustrated in parts (A) and (B) of FIG. 3. The voltage detection circuit 14*a* may thus set the switching device SW to the on-state (see part (C) of FIG. 3), and set the step-up circuit 11 to the operating state. As a result, as illustrated in FIG. 4, the following two power supply routes Rp1 and Rp2 are provided in the power supply apparatus 1.

The power supply route Rp1 may allow the voltage V2*a* to be supplied from the step-down circuit 12*a* to the flash memory 21 and the memory controller 22, based on a voltage supplied from the power supply terminal Tin to the step-down circuit 12*a* through the coupling line L1, in other words, based on the voltage V2 as the step-up voltage outputted from the step-up circuit 11, as illustrated in FIG. 4. Thus, during the normal operation, the power supply route Rp1 may be used to supply the voltage V2*a* to the flash memory 21 and the memory controller 22. Further, during the normal operation, the power supply route Rp1 may also be used to supply the voltage V2 as the step-up voltage outputted from the step-up circuit 11 to the capacitor C along with the step-down circuit 12*a*, as illustrated in FIG. 4, to thereby charge the capacitor C.

The power supply route Rp2 may allow the voltage V2*b* to be supplied from the step-down circuit 12*b* to the memory controller 22 and allow the voltage V2*c* to be supplied from the step-down circuit 12*c* to the flash memory 21 and the memory controller 22, based on the voltage supplied from the power supply terminal Tin to each of the step-down circuits 12*b* and 12*c* through the coupling line L2, that is, the voltage VL having passed through the diode D1, as illustrated in FIG. 4. Thus, during the normal operation, the power supply route Rp2 may be used to supply the voltage V2*b* to the memory controller 22 and supply the voltage V2*c* to the flash memory 21 and the memory controller 22.

Further, during the normal operation, the voltage V2*a* may be monitored by the voltage detection circuit 14*b*. If it is confirmed that the voltage V2*a* is sufficiently high as power supply to the flash memory 21, the signal FWP may turn "H", as illustrated in part (D) of FIG. 3. This causes the signal POR outputted from the AND circuit 132 to turn "H" as illustrated in part (E) of FIG. 3, because the signal V1_EN is "H" as described above. The memory controller 22 may be thereby brought into the operating state. Accordingly, as illustrated in parts (F) and (G) of FIG. 3, for example, based on data (DATA including Write DATA_A and Write Data_B) supplied to the flash memory 21, data writing may be performed on a cell in the flash memory 21 during a period over which the signal FBSY is "L".

Note that during the normal operation, to prevent the voltage V2*a* outputted from the step-down circuit 12*a* from being supplied to the step-down circuits 12*b* and 12*c* through the diode D2 (see a dashed arrow in the vicinity of the diode D2 in FIG. 4), the following magnitude relationship may be satisfied:

$$(V2a - \mathrm{D2\_Vf}) < VL(= V1 - \mathrm{D1\_Vf})$$

where D1_Vf and D2_Vf represent forward voltages of the diodes D1 and D2, respectively.

In other words, during the normal operation, no electric power may be supplied from the step-down circuit 12*a* to the step-down circuits 12*b* and 12*c* through the power supply route Rp3, as illustrated in FIG. 4, unlike during power-down described below.

[B-2. During Power-Down]

During power-down illustrated in FIG. 3, the memory system 4 of the example embodiment may operate, for example, in a manner illustrated in FIG. 5, for example.

For example, during the power-down, the signal V1_EN is "L" because the voltage V1 received at the power supply terminal Tin is lower than the threshold voltage Vth, that is, V1<Vth as illustrated in parts (A) and (B) of FIG. 3. The voltage detection circuit 14*a* may thus set the switching device SW to the off-state (see part (C) of FIG. 3), and set the operation of the step-up circuit 11 to the stopped state. In addition, because the signal V1_EN is "L" as described above, the signal POR outputted from the AND circuit 132 may also turn "L" as illustrated in part (E) of FIG. 3, which brings the operations of the memory controller 22 also into the stopped state.

As a result, during the power-down, the following operations may be performed through the power supply route Rp1 described above and the power supply route Rp3 described below, as illustrated in FIG. 5. For example, electric power stored in the capacitor C may be supplied to the step-down circuit 12*a*, and the voltage V2*a* may be supplied from the step-down circuit 12*a* to the flash memory 21 and the memory controller 22, as illustrated in FIG. 5. Further, the electric power stored in the capacitor C may be supplied to the step-down circuits 12*b* and 12*c* through the coupling line L3, i.e., through the diode D2. Based on the electric power supplied to the step-down circuits 12*b* and 12*c*, in other words, based on a voltage supplied to the step-down circuits 12*b* and 12*c*, the voltage V2*b* may be supplied from the step-down circuit 12*b* to the memory controller 22 and the voltage V2*c* may be supplied from the step-down circuit 12*c* to the flash memory 21 and the memory controller 22, as illustrated in FIG. 5. Thus, during the power-down, the power supply route Rp1 may be used to supply the voltage V2*a* to the flash memory 21 and the memory controller 22, and the power supply route Rp3 may be used to supply the voltage V2*b* to the memory controller 22 and supply the voltage V2*c* to the flash memory 21 and the memory controller 22.

Note that during the power-down, the switching device SW may be in the off-state as described above, which helps to prevent the electric power stored in the capacitor C from escaping toward the host through the power supply terminal Tin. Further, during the power-down, to allow the voltage V2*a* outputted from the step-down circuit 12*a* to be supplied to the step-down circuits 12*b* and 12*c* through the power supply route Rp3 (i.e., through the diode D2), the following magnitude relationship may be satisfied:

$$(V2a - \mathrm{D2\_Vf}) < VL(= V1 - \mathrm{D1\_Vf}),$$

which is inverse to the relationship to be satisfied during the normal operation described above.

In this way, according to the example embodiment, even when power-down occurs, that is, even during "Power-_Down" in FIG. 3, the following is achievable regarding the period over which the flash memory 21 is busy, that is, the period of data writing to a cell. For example, power supply voltages (i.e., the voltages V2*a* to V2*c* described above) are retained over a predetermined period of time. See a period from the timing t6 to the timing t7 in part (A) of FIG. 3. Note that the capacitor C as a large-capacitance capacitor may have a capacitance large enough to retain a time duration greater than or equal to that of the period over which the flash memory 21 is busy, that is, the period of data writing to a cell. This allows for securing of data even if power-down occurs in the period of data writing to a cell in the flash memory 21.

In the foregoing comparative example, the electric charge stored in the capacitor C as the large-capacitance capacitor is supplied to the step-down circuits 91*a* to 91*d* through the diode D2 after switching of the switching device SW from the on-state to the off-state. In the example embodiment also, the switching device SW simply serves to decouple a side of the step-up circuit 11 and a side of the capacitor C and the step-down circuit 12*a* from each other upon occurrence of power-down, and is not intended to allow the electric charge stored in the capacitor C to pass through the switching device SW for supply of the electric charge. Thus, in the example embodiment also, the electric charge is continuously suppliable from the capacitor C, without delay caused by switching of the switching device SW, as in the comparative example.

Note that during the power-down, the operations of the memory controller 22, including an internal operation and a communication operation with the flash memory 21, are stopped as described above. This results in a sudden decrease in load of the voltage V1, which can lead to a momentary rise in the voltage V1. In such a case, the voltage detection circuit 14*a* can respond to the momentary rise in the voltage V1, which can result in switching of the signal POR from "L" to "H" or result in an erroneous operation of the switching device SW. To address this, in detecting the voltage V1 at the voltage detection circuit 14*a*, for example, a hysteresis may be provided on the threshold voltage Vth described above. For example, when the voltage V1 rises, the voltage detection circuit 14*a* may switch the signal V1_EN from "L" to "H" if the voltage V1 exceeds a threshold voltage Vth1 of 2.75 V. In contrast, when the voltage V1 drops, the voltage detection circuit 14*a* may switch the signal V1_EN from "H" to "L" if the voltage V1 falls below a threshold voltage Vth2 of 2.65 V. Providing the hysteresis on the threshold voltage Vth in such a manner helps to prevent the erroneous operation described above.

The power supply route Rp1 described above may correspond to a specific but non-limiting example of a "first power supply route" in one embodiment of the disclosure. The power supply route Rp2 described above may correspond to a specific but non-limiting example of a "second power supply route" in one embodiment of the disclosure. The power supply route Rp3 described above may correspond to a specific but non-limiting example of a "third power supply route" in one embodiment of the disclosure.

C. Workings and Example Effects

In the example embodiment, the step-down circuits 12*a* to 12*c*, the step-up circuit 11, the switching device SW, the capacitor C, and the diode D1 are each provided in the above-described configuration on the foregoing coupling line L1 or L2. As a result, the following are achievable in performing power supply, that is, in supplying each of the voltages V2*a* to V2*c* from corresponding one of the step-down circuits 12*a* to 12*c* to the memory controller 22 or to both the flash memory 21 and the memory controller 22, based on the voltage V1 supplied from the power supply terminal Tin. For example, while the voltage V2 as the step-up voltage outputted from the step-up circuit 11 is supplied to each of the step-down circuit 12*a* and the capacitor C through the coupling line L1, voltage supply to the step-down circuits 12*b* and 12*c* is performed through the coupling line L2, that is, through the diode D1. Thus, the voltage V2 as the step-up voltage outputted from the step-up circuit 11 is to be supplied to the step-down circuit 12*a* alone among the step-down circuits 12*a*, 12*b*, and 12*c*. Accordingly, the example embodiment helps to allow for reduction in operational burden on the step-up circuit 11, as compared with a case where, for example, the step-up voltage is to be supplied to all of multiple step-down circuits, as in the comparative example described above. As a result, the example embodiment helps to reduce power consumption in the power supply apparatus 1 and the memory system 4.

Further, in the example embodiment, the three power supply routes Rp1 to Rp3 described above may be provided. During the normal operation where V1≥Vth, the power supply route Rp1 based on the voltage V1 may be used to supply the voltage V2*a* to the flash memory 21 and the memory controller 22, and the power supply route Rp2 based on the same voltage V1 may be used to supply the voltage V2*b* to the memory controller 22 and to supply the voltage V2*c* to the flash memory 21 and the memory controller 22. In contrast, during the power-down where V1<Vth, power supply based on the voltage V1 is not expectable; thus, the voltage V2*a* may be supplied to the flash memory 21 and the memory controller 22 through the power supply route Rp1 from the capacitor C. Further, the voltage V2*a* may be supplied from the step-down circuit 12*a* to the step-down circuits 12*b* and 12*c* through the power supply route Rp3 via the diode D2, which allows the voltage V2*b* to be supplied to the memory controller 22 and allows the voltage V2*c* to be supplied to the flash memory 21 and the memory controller 22. In this way, the combination of the power supply routes for use is switchable among the power supply routes Rp1 to Rp3 in accordance with the magnitude relationship between the voltage V1 and the threshold voltage Vth. This helps to effectively reduce power consumption in the power supply apparatus 1 and the memory system 4.

2. Modification Examples

Modification Examples 1 and 2 of the foregoing example embodiment will now be described. In the following description, the same reference signs are assigned to components the same as those in the example embodiment, and descriptions thereof will be omitted as appropriate.

Modification Example 1

[Configuration]

Figure 6:
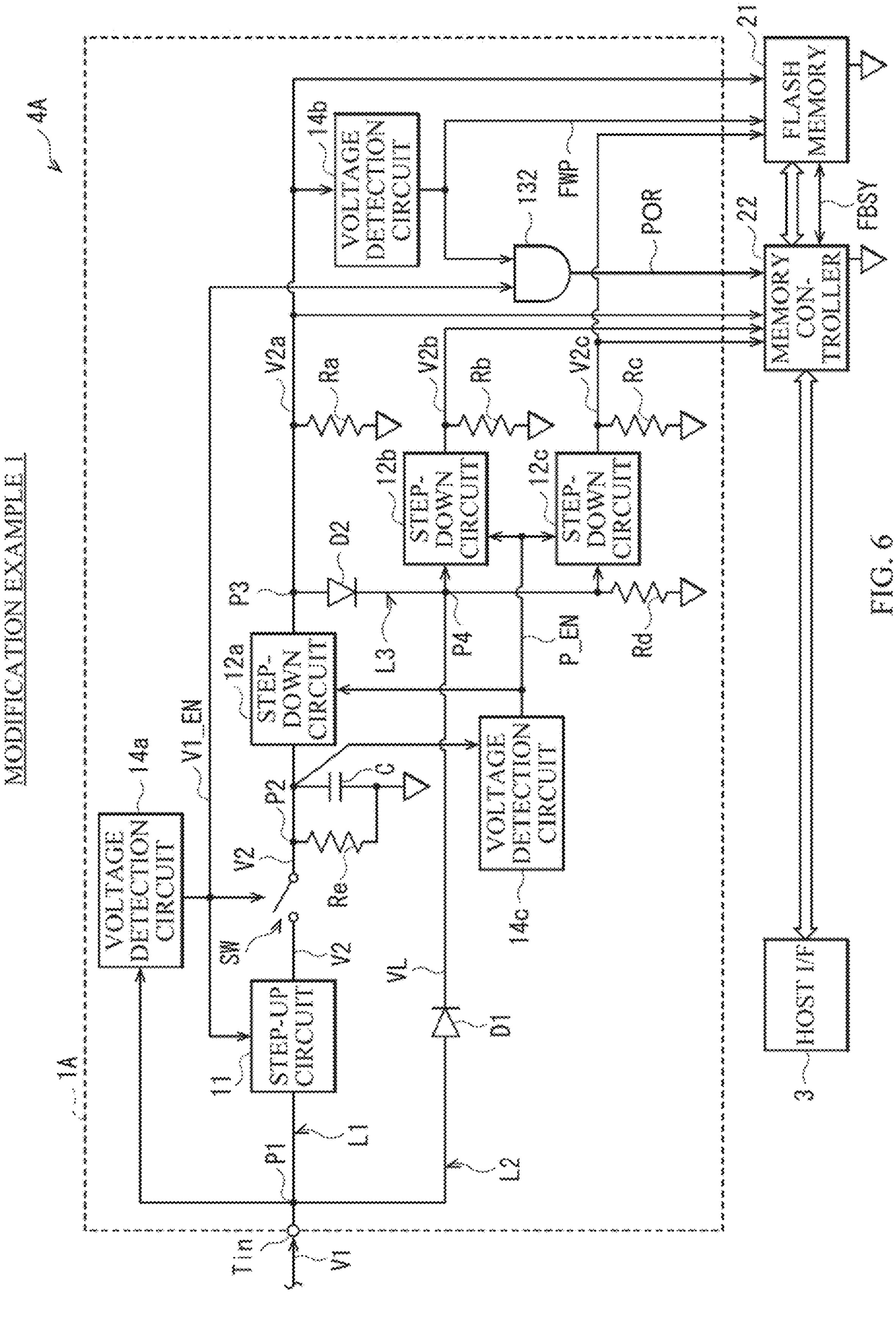
FIG. 6 is a circuit diagram illustrating a schematic configuration example of a memory system according to Modification Example 1 of one example embodiment of the disclosure.

FIG. 6 is a circuit diagram illustrating a schematic configuration example of a memory system 4A according to Modification Example 1 of an embodiment of the disclosure. The memory system 4A according to Modification Example 1 may correspond to the memory system 4 according to the example embodiment in which the power supply apparatus 1 is replaced with a power supply apparatus 1A. The power supply apparatus 1A may correspond to the power supply apparatus 1 of the example embodiment illustrated in FIG. 1 in which a voltage detection circuit 14*c* described below is further provided. The power supply apparatus 1A may be otherwise basically similar in configuration to the power supply apparatus 1.

The voltage detection circuit 14*c* may be a circuit that detects a voltage at a point between the switching device SW and the step-down circuit 12*a* on the coupling line L1, that is, at the node P2, as illustrated in FIG. 6. The voltage detection circuit 14*c* may output a signal P_EN that is "L" or "H" depending on a magnitude of the voltage having been detected. When the signal P_EN is "L", the step-down circuits 12*a* to 12*c* may be set to the stopped state to allow none of the voltages V2*a* to V2*c* to be outputted. In contrast, when the signal P_EN is "H", the step-down circuits 12*a* to 12*c* may be set to the operating state to allow the voltages V2*a* to V2*c* to be outputted. In this way, the step-down circuits 12*a* to 12*c* may be collectively set to the operating state or the stopped state to thereby control supply timings (and stop timings) of the voltages V2*a* to V2*c* from the respective step-down circuits 12*a* to 12*c* to be aligned with each other, as will be described in detail later.

[Operation]

Next, with reference to FIGS. 7 to 9 as well as FIG. 6, an operation example of the memory system 4A and the power supply apparatus 1A according to Modification Example 1 will be described in detail.

Figure 7:
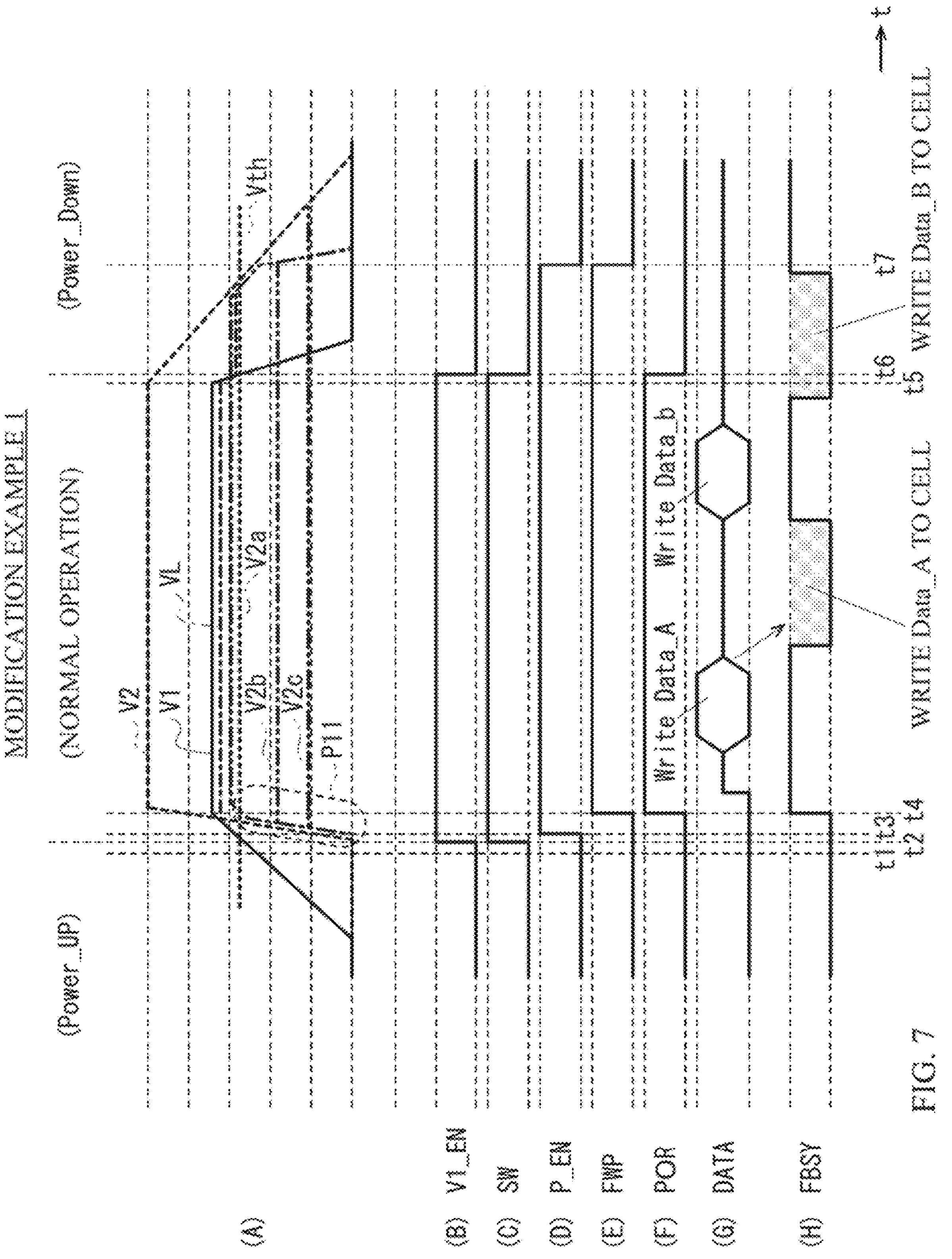
FIG. 7 is a timing diagram illustrating an operation example of the memory system illustrated in FIG. 6.

FIG. 7 is a timing diagram illustrating an operation example of the memory system 4A illustrated in FIG. 6, that is, an example of operations during the normal operation, during the "Power_Down", and during the "Power_Up" described above. For example, part (A) of FIG. 7 illustrates the foregoing voltages V1, V2, V2*a* to V2*c*, and VL together. Part (B) of FIG. 7 illustrates the foregoing signal V1_EN. Part (C) of FIG. 7 illustrates the on- and off-states of the switching device SW. Part (D) of FIG. 7 illustrates the foregoing signal P_EN. Parts (E), (F), and (H) of FIG. 7 illustrate the foregoing signals FWP, POR, and FBSY, respectively. Part (G) of FIG. 7 illustrates data (DATA) supplied to the flash memory 21. In FIG. 7, the horizontal axis represents time t. The timings t1 to t7 along the time t are indicated in FIG. 7.

Figure 8:
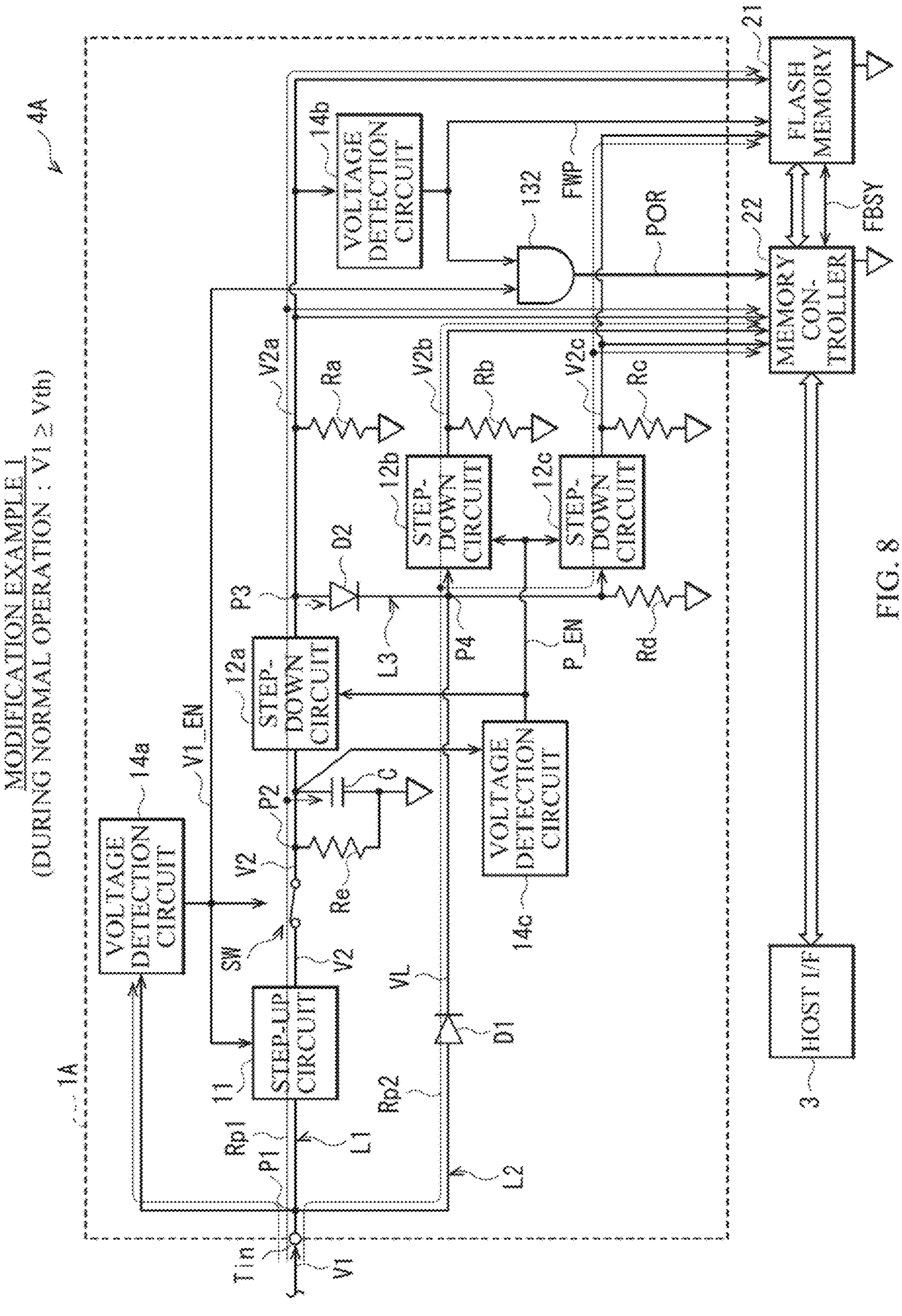
FIG. 8 is a circuit diagram illustrating an example of an operation state during normal operation in FIG. 7.

FIG. 8 is a circuit diagram illustrating an example of an operation state during the normal operation in FIG. 7, that is, during a period from the timing t2 to the timing t6 in FIG. 7 in which the voltage V1 is higher than or equal to the threshold voltage Vth. FIG. 9 is a circuit diagram illustrating an example of an operation state during power-down ("Power_Down") in FIG. 7, that is, when the voltage V1 is lower than the threshold voltage Vth (i.e., at and after the timing t6 in FIG. 7). Note that the period from the start to the timing t2 in FIG. 7 may correspond to the "Power-Up" period in which the voltage V1 is lower than the threshold voltage Vth. In FIGS. 8 and 9, the foregoing power supply routes Rp1 to Rp3 are indicated by respective arrows.

In the memory system 4A of Modification Example 1 also, operations may be performed in a manner basically similar to that in the memory system 4 of the example embodiment described above.

First, during the normal operation illustrated in FIG. 7 (i.e., when the voltage V1 is higher than or equal to the threshold voltage Vth), the memory system 4A may operate in a manner illustrated in FIG. 8, for example, similarly to the case of the example embodiment illustrated in FIG. 4. For example, during the normal operation, the power supply route Rp1 may be used to supply the voltage V2*a* to the flash memory 21 and the memory controller 22, and to charge the capacitor C, based on the voltage V2 outputted from the step-up circuit 11. Further, during the normal operation, the power supply route Rp2 may be used to supply the voltage V2*b* to the memory controller 22 and supply the voltage V2*c* to the flash memory 21 and the memory controller 22.

At this time, in the present modification example, the signal P_EN outputted from the voltage detection circuit 14*c* may be used to control the supply timings (and the stop timings) of the voltages V2*a* to V2*c* to the flash memory 21 and the memory controller 22, as described above. For example, a timing of supply of the voltage V2*a* from the step-down circuit 12*a* and a timing of supply of the voltages V2*b* and V2*c* from the respective step-down circuits 12*b* and 12*c* may be controlled into alignment with each other through the use of the signal P_EN. See, for example, timings in a dashed ellipse P11 in FIG. 7.

Figure 9:
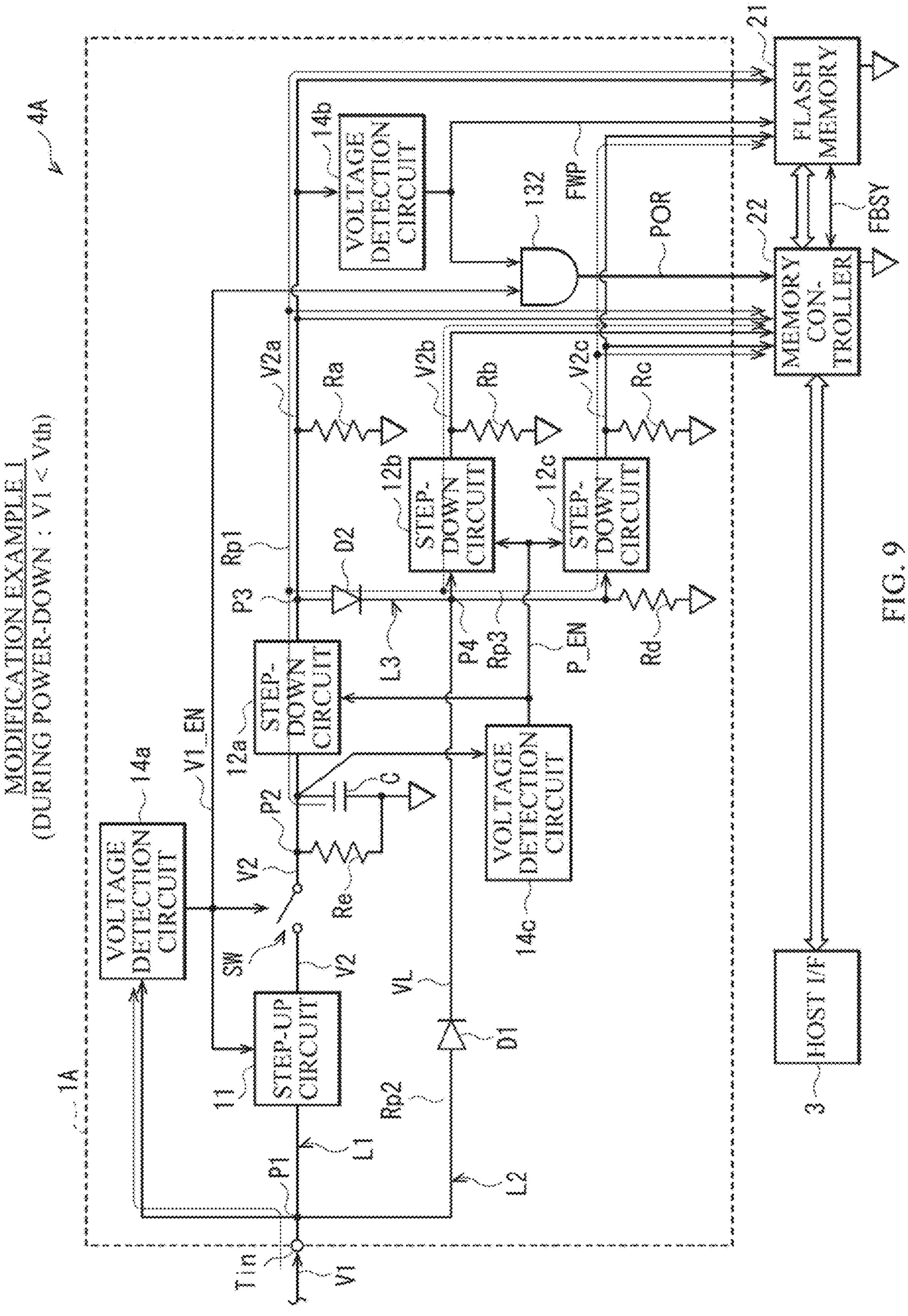
FIG. 9 is a circuit diagram illustrating an example of an operation state during power-down in FIG. 7.

In contrast, during the power-down illustrated in FIG. 7 (i.e., when the voltage V1 is lower than the threshold voltage Vth), the memory system 4A may operate in a manner illustrated in FIG. 9, for example, similarly to the case of the example embodiment illustrated in FIG. 5. For example, during the power-down, the power supply route Rp1 may be used to supply the voltage V2*a* to the flash memory 21 and the memory controller 22, based on the electric charge stored in the capacitor C. Further, the power supply route Rp3 may be used to supply the voltage V2*b* to the memory controller 22 and supply the voltage V2*c* to the flash memory 21 and the memory controller 22.

[Workings and Example Effects]

In Modification Example 1 described above, effects similar to those of the example embodiment are achievable through basically similar workings. For example, Modification Example 1 also helps to reduce power consumption in the power supply apparatus 1A and the memory system 4A, as compared with the comparative example described above.

In Modification Example 1, as described above, the timing of supply of the voltage V2*a* from the step-down circuit 12*a* and the timing of supply of the voltages V2*b* and V2*c* from the respective step-down circuits 12*b* and 12*c* may be controlled into alignment with each other. This helps to achieve a state of readiness to respond, as a storage device, to a host system in a minimum period of time, without awaiting a rise time of each of voltages to be used in the flash memory 21 and the memory controller 22, that is, the voltages V2*a* to V2*c*.

Modification Example 2

[Configuration]

Figure 10:
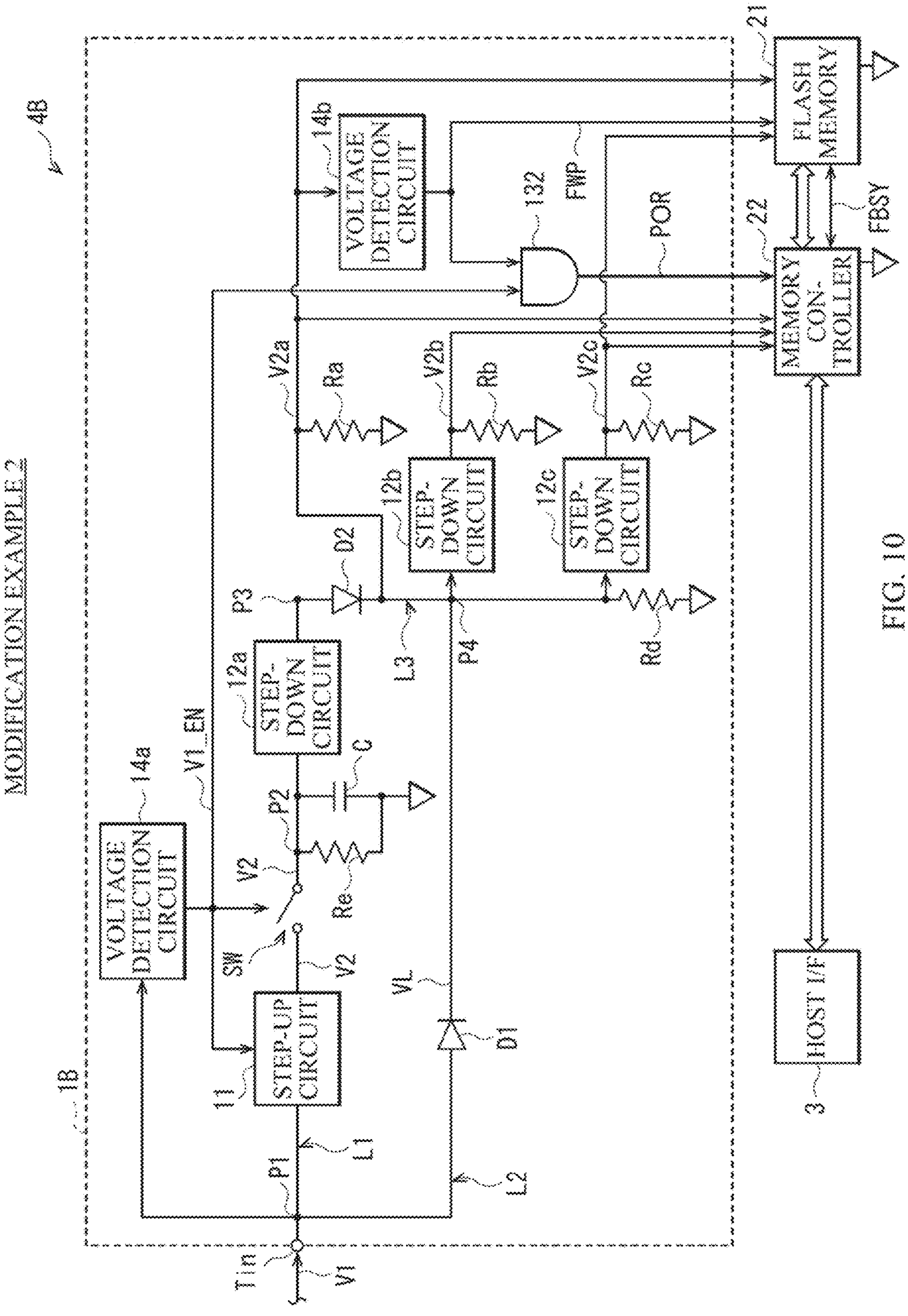
FIG. 10 is a circuit diagram illustrating a schematic configuration example of a memory system according to Modification Example 2 of one example embodiment of the disclosure.

FIG. 10 is a circuit diagram illustrating a schematic configuration example of a memory system 4B according to Modification Example 2 of an embodiment of the disclosure. The memory system 4B according to Modification Example 2 may correspond to the memory system 4 according to the example embodiment in which the power supply apparatus 1 is replaced with a power supply apparatus 1B. The memory system 4B may be otherwise similar in configuration to the memory system 4.

The power supply apparatus 1B may correspond to the power supply apparatus 1 with a modification made to the circuit configuration (i.e., a coupling configuration of wirings) on the output side of the step-down circuit 12*a*, and may be otherwise similar in configuration to the power supply apparatus 1. For example, on the output side of the step-down circuit 12*a* in the power supply apparatus 1 (see FIG. 1), an anode side of the diode D2, i.e., the node P3, may be coupled to one end side of the dummy resistor Ra. In contrast, on the output side of the step-down circuit 12*a* in the power supply apparatus 1B (see FIG. 10), a cathode side of the diode D2, i.e., the node P4, may be coupled to the one end side of the dummy resistor Ra.

[Operation]

Having such a configuration, the memory system 4B (the power supply apparatus 1B) may operate in the following manner, unlike the memory system 4 (the power supply apparatus 1). Note that the following description will focus on differences of an operation example of the memory system 4B (the power supply apparatus 1B) from the operation example of the memory system 4 (the power supply apparatus 1).

Figure 11:
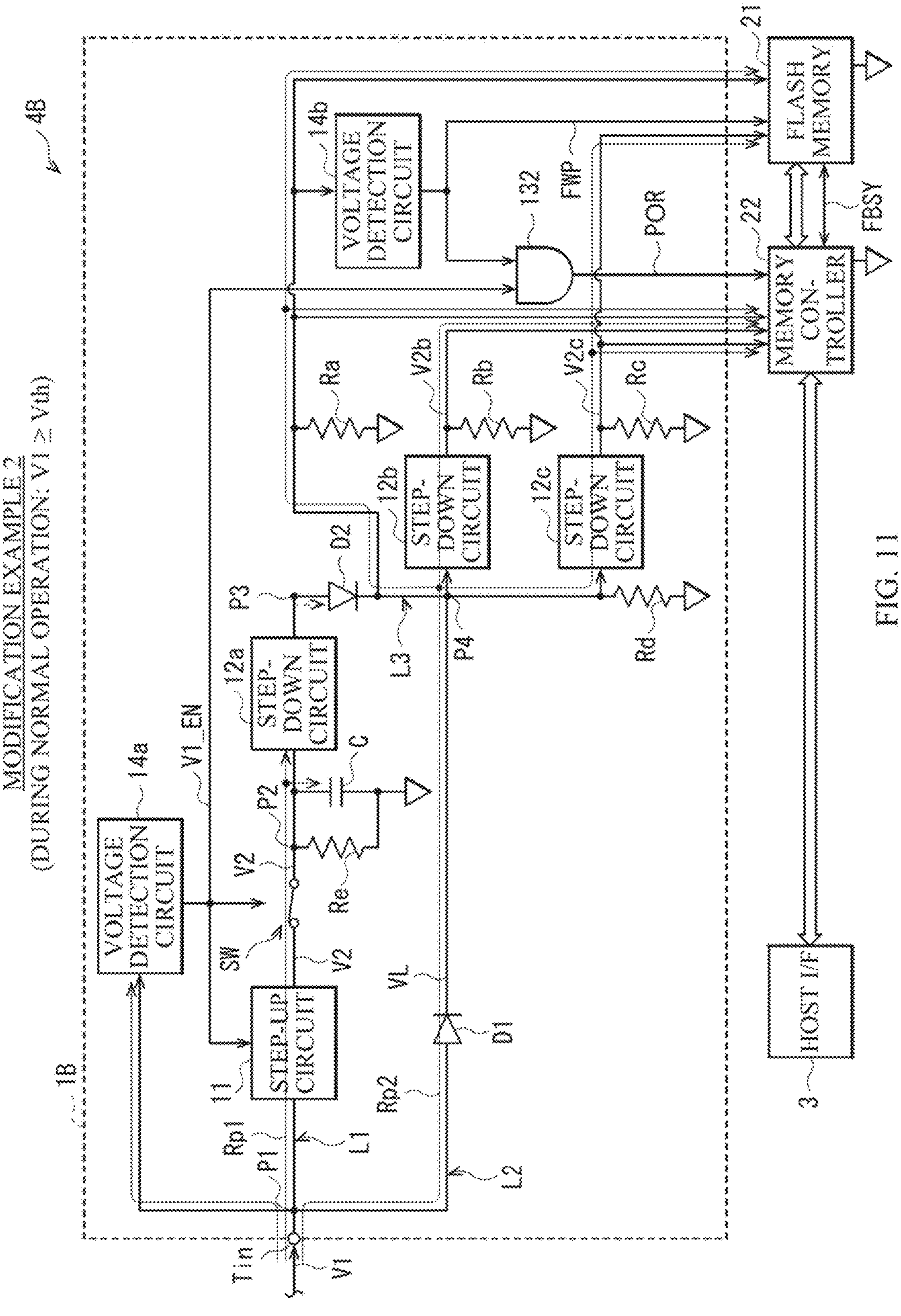
FIG. 11 is a circuit diagram illustrating an example of an operation state during normal operation in FIG. 10.
Figure 12:
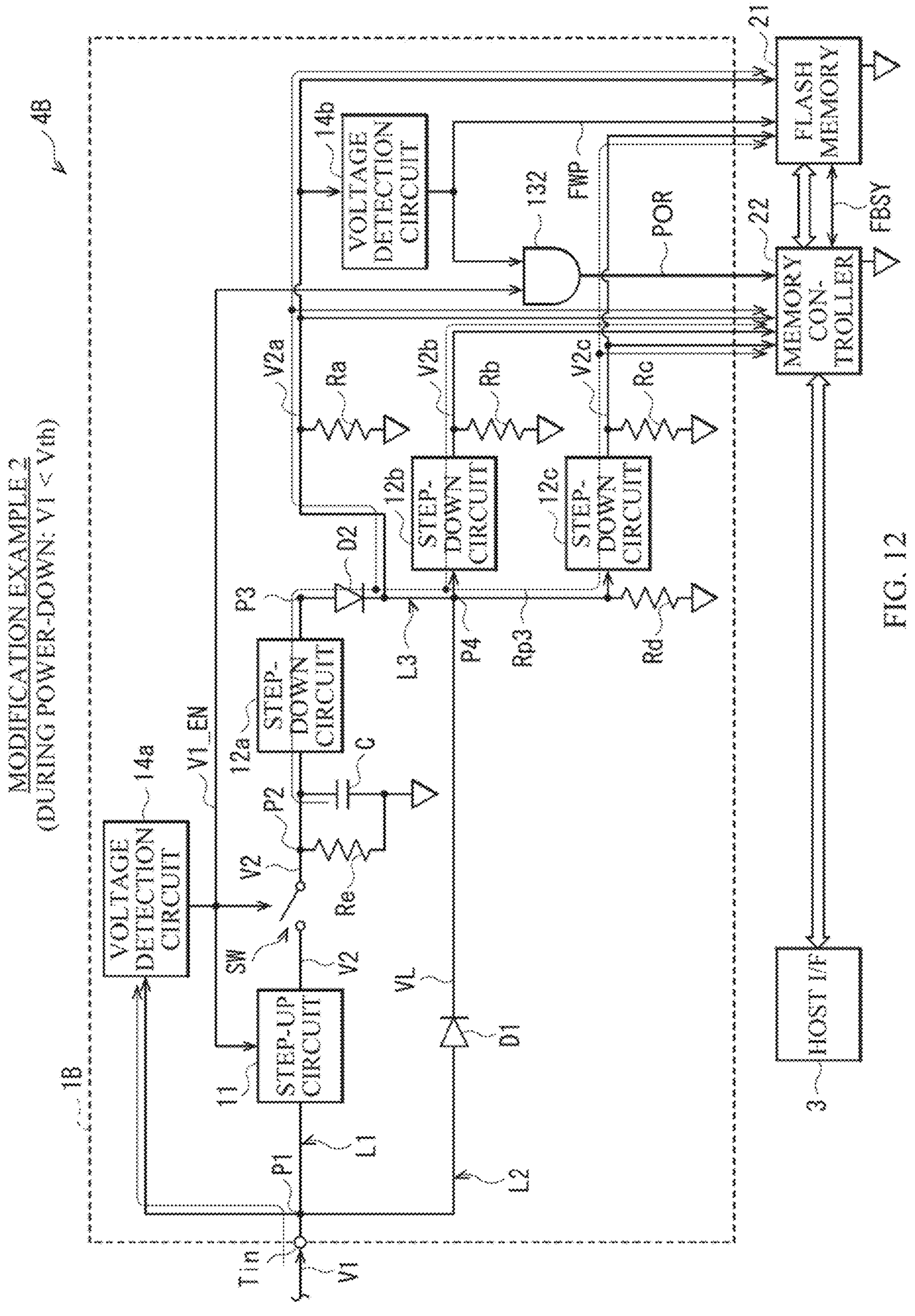
FIG. 12 is a circuit diagram illustrating an example of an operation state during power-down in FIG. 10.

FIG. 11 is a circuit diagram illustrating an example of an operation state during the normal operation in FIG. 10 (i.e., when the voltage V1 is higher than or equal to the threshold voltage Vth). FIG. 12 is a circuit diagram illustrating an example of an operation state during the power-down in FIG. 10 (i.e., when the voltage V1 is lower than the threshold voltage Vth).

First, during the normal operation of the power supply apparatus 1B illustrated in FIG. 11, unlike in the case of the power supply apparatus 1, a voltage on a cathode side of the diode D1 may be higher than a voltage on the cathode side of the diode D2. Accordingly, no voltage V2*a* may be supplied from the step-down circuit 12*a* to the flash memory 21 or the memory controller 22. During the normal operation of the power supply apparatus 1*i*, the voltage VL having passed through the diode D1 may be supplied through the power supply route Rp2 to the flash memory 21 and the memory controller 22 via a coupling line of the dummy resistor Ra (see FIG. 11). Further, during the normal operation of the power supply apparatus 1*i*, the power supply route Rp2 may also be used to supply the voltage V2*b* from the step-down circuit 12*b* to the memory controller 22 and supply the voltage V2*c* from the step-down circuit 12*c* to the flash memory 21 and the memory controller 22, as in the case of the normal operation of the power supply apparatus 1 (see FIG. 4).

In contrast, during the power-down of the power supply apparatus 1B illustrated in FIG. 12, unlike in the case of the power supply apparatus 1, the voltage on the cathode side of the diode D1 may be lower than the voltage on the cathode side of the diode D2. Accordingly, the voltages V2*a*, V2*b*, and V3*c* may each be supplied to the memory controller 22 or to both the flash memory 21 and the memory controller 22 through the power supply route Rp3. For example, during the power-down of the power supply apparatus 1*i*, unlike in the case of the power-down of the power supply apparatus 1 (see FIG. 5), the voltage having been outputted from the step-down circuit 12*a* and having passed through the coupling line L3 (the diode D2) may be supplied as the voltage V2*a* to the flash memory 21 and the memory controller 22 (see FIG. 12). Based on the voltage having passed through the coupling line L3 from the step-down circuit 12*a*, the voltages V2*b* and V2*c* may be outputted from the step-down circuits 12*b* and 12*c*, respectively, and may each be supplied to the memory controller 22 or to both the flash memory 21 and the memory controller 22, as in the case of the power-down of the power supply apparatus 1.

[Workings and Example Effects]

In Modification Example 2 described above, effects similar to those of the example embodiment are achievable through basically similar workings. For example, Modification Example 2 also helps to reduce power consumption in the power supply apparatus 1B and the memory system 4B, as compared with the comparative example described above.

Further, in Modification Example 2, during the normal operation, as described above, the voltages VL, V2*b*, and V2*c* that have passed through the diode D1 may each be supplied to the memory controller 22 or to both the flash memory 21 and the memory controller 22 through the power supply route Rp2, not the power supply route Rp1 that is used in the case of the example embodiment. Thus, as compared with the example embodiment, Modification Example 2 helps to lighten a load at the step-up circuit 11, and accordingly helps to scale down (i.e., reduce a current capacity of) the step-up circuit 11.

3. Other Modification Examples

The disclosure has been described hereinabove with reference to the example embodiment and the modification examples. However, the disclosure is not limited thereto, and may be modified in a variety of ways.

For example, in the example embodiment and the modification examples, the description has been given of an example of circuit configurations of the memory system and the power supply apparatus; however, such an example is non-limiting, and any of other suitable circuit configurations may be employed.

For example, in the example embodiment and the modification examples, the description has been given of an example case where the power supply apparatus includes two second step-down circuits (i.e., the step-down circuits 12*b* and 12*c*); however, such an example is non-limiting. In some embodiments, the power supply apparatus may include a single second step-down circuit, or three or more second step-down circuits.

Further, in the example embodiment and the modification examples, the description has been given of an example case where the "second reverse-flow prevention diode" according to an embodiment of the disclosure, i.e., the diode D2, and the "third power supply route" according to an embodiment of the disclosure, i.e., the power supply route Rp3, may be provided in the power supply apparatus; however, such an example is non-limiting. In some embodiments, the "second reverse-flow prevention diode" and "the third power supply route" may be omitted from the power supply apparatus.

Further, in the example embodiment and the modification examples, the description has been given of an example case where the memory system includes the flash memory and the memory controller that each correspond to a specific but non-limiting example of the "memory device" in one embodiment of the disclosure; however, such an example is non-limiting. In some embodiments, the memory system may include either one of the flash memory or the memory controller.

Further, in the example embodiment and the modification examples, the description has been given of example operations of the memory system and the power supply apparatus; however, the example operations described in the example embodiment and the modification examples are non-limiting, and any other suitable operations may be employed.

Further, in the example embodiment and the modification examples, the description has been given of an example of the memory system such as the flash memory system applicable to a memory device (e.g., a flash memory device) such as a flash memory; however, such an example is non-limiting. In some embodiments, the memory system according to an embodiment of the disclosure may be applied to a memory device other than the flash memory device.

Moreover, any two or more of the configuration examples and other examples described so far may be combined and applied in a desired manner. The disclosure encompasses any possible combination of some or all of the various embodiments described herein and incorporated herein.

It is possible to achieve at least the following configurations from the foregoing example embodiment and modification examples of the disclosure.

(1)

A power supply apparatus configured to generate a voltage to be supplied to a memory device, the power supply apparatus including:

- a power supply terminal configured to receive an input voltage from outside;
- a first step-down circuit configured to generate a first output voltage to be supplied to the memory device;
- a second step-down circuit configured to generate a second output voltage to be supplied to the memory device;
- a first coupling line coupling the power supply terminal and the first step-down circuit to each other;
- a second coupling line coupling the power supply terminal and the second step-down circuit to each other;
- a step-up circuit disposed on the first coupling line at a location between the power supply terminal and the first step-down circuit, and configured to step up the input voltage supplied from the power supply terminal;
- a switching device disposed on the first coupling line at a location between the step-up circuit and the first step-down circuit;
- a capacitor disposed on the first coupling line at a location between the switching device and the first step-down circuit; and
- a first reverse-flow prevention diode disposed on the second coupling line at a location between the power supply terminal and the second step-down circuit.

(2)

The power supply apparatus according to (1), further including:

- a first power supply route through which the first output voltage is to be supplied from the first step-down circuit to the memory device, based on a voltage supplied to the first step-down circuit through the first coupling line; and
- a second power supply route through which the second output voltage is to be supplied from the second step-down circuit to the memory device, based on a voltage supplied to the second step-down circuit through the second coupling line.

(3)

The power supply apparatus according to (2), further including:

- a third coupling line coupling an output side of the first step-down circuit and an input side of the second step-down circuit to each other;
- a second reverse-flow prevention diode disposed on the third coupling line; and
- a third power supply route through which the second output voltage is to be supplied from the second step-down circuit to the memory device, based on a voltage supplied to the second step-down circuit through the third coupling line.

(4)

The power supply apparatus according to (3), in which the power supply apparatus is configured to:

- supply the first output voltage to the memory device through the first power supply route and supply the second output voltage to the memory device through the second power supply route, when the input voltage is higher than or equal to a threshold voltage; and
- supply the first output voltage to the memory device through the first power supply route and supply the second output voltage to the memory device through the third power supply route, when the input voltage is lower than the threshold voltage.

(5)

The power supply apparatus according to (3), in which the power supply apparatus is configured to:

- supply each of a voltage having passed through the first reverse-flow prevention diode and the second output voltage to the memory device through the second power supply route, when the input voltage is higher than or equal to a threshold voltage; and
- supply each of the first output voltage and the second output voltage to the memory device through the third power supply route, when the input voltage is lower than the threshold voltage.

(6)

The power supply apparatus according to any one of (1) to (5), further including

- a voltage detection circuit configured to detect the input voltage,
- the voltage detection circuit being configured to:
- perform control, when the input voltage is higher than or equal to a threshold voltage, to cause a step-up voltage outputted from the step-up circuit to be supplied to each of the first step-down circuit and the capacitor, by setting the switching device to an on-state; and
- perform control, when the input voltage is lower than the threshold voltage, to cause electric power stored in the capacitor to be supplied to the first step-down circuit, by setting the switching device to an off-state.

(7)

The power supply apparatus according to any one of (1) to (6), in which the second output voltage to be outputted from the second step-down circuit is lower than the first output voltage to be outputted from the first step-down circuit.

(8)

The power supply apparatus according to any one of (1) to (7), in which the power supply apparatus is configured to align a timing of supply of the first output voltage from the first step-down circuit to the memory device and a timing of supply of the second output voltage from the second step-down circuit to the memory device with each other.

(9)

The power supply apparatus according to any one of (1) to (8), in which the memory device includes a flash memory, a memory controller, or both.

(10)

A memory system including:

- the power supply apparatus according to any one of (1) to (9); and
- the memory device.

The power supply apparatus and the memory system according to at least one embodiment of the disclosure each make it possible to reduce power consumption.

The effects described herein are mere examples and non-limiting, and other effects may be achieved.

Although the disclosure has been described hereinabove in terms of the example embodiment and modification examples, the disclosure is not limited thereto. It should be appreciated that variations may be made in the described example embodiment and modification examples by those skilled in the art without departing from the scope of the disclosure as defined by the following claims.

The limitations in the claims are to be interpreted broadly based on the language employed in the claims and not limited to examples described in this specification or during the prosecution of the application, and the examples are to be construed as non-exclusive.

As used in this specification and the appended claims, the singular forms "a," "an," and "the" include, especially in the context of the claims, are to be construed to cover both the singular and the plural, unless otherwise indicated herein or clearly contradicted by context.

Throughout this specification and the appended claims, unless the context requires otherwise, the terms "comprise", "include", "have", and their variations are to be construed to cover the inclusion of a stated element, integer or step but not the exclusion of any other non-stated element, integer or step.

The use of the terms first, second, etc. do not denote any order or importance, but rather the terms first, second, etc. are used to distinguish one element from another.

The term "substantially", "approximately", "about", and its variants having the similar meaning thereto are defined as being largely but not necessarily wholly what is specified as understood by one of ordinary skill in the art.

The term "disposed on/provided on/formed on" and its variants having the similar meaning thereto as used herein refer to elements disposed directly in contact with each other or indirectly by having intervening structures therebetween.

What is claimed is:

1. A power supply apparatus configured to generate a voltage to be supplied to a memory device, the power supply apparatus comprising:

a power supply terminal configured to receive an input voltage from outside;

a first step-down circuit configured to generate a first output voltage to be supplied to the memory device;

a second step-down circuit configured to generate a second output voltage to be supplied to the memory device;

a first coupling line coupling the power supply terminal and the first step-down circuit to each other;

a second coupling line coupling the power supply terminal and the second step-down circuit to each other;

a step-up circuit disposed on the first coupling line at a location between the power supply terminal and the first step-down circuit, and configured to step up the input voltage supplied from the power supply terminal;

a switching device disposed on the first coupling line at a location between the step-up circuit and the first step-down circuit;

a capacitor disposed on the first coupling line at a location between the switching device and the first step-down circuit; and a first reverse-flow prevention diode disposed on the second coupling line at a location between the power supply terminal and the second step-down circuit.

2. The power supply apparatus according to claim 1, further comprising:

a first power supply route through which the first output voltage is to be supplied from the first step-down circuit to the memory device, based on a voltage supplied to the first step-down circuit through the first coupling line; and a second power supply route through which the second output voltage is to be supplied from the second step-down circuit to the memory device, based on a voltage supplied to the second step-down circuit through the second coupling line.

3. The power supply apparatus according to claim 2, further comprising:

a third coupling line coupling an output side of the first step-down circuit and an input side of the second step-down circuit to each other;

a second reverse-flow prevention diode disposed on the third coupling line; and a third power supply route through which the second output voltage is to be supplied from the second step-down circuit to the memory device, based on a voltage supplied to the second step-down circuit through the third coupling line.

4. The power supply apparatus according to claim 3, wherein the power supply apparatus is configured to:

supply the first output voltage to the memory device through the first power supply route and supply the second output voltage to the memory device through the second power supply route, when the input voltage is higher than or equal to a threshold voltage; and supply the first output voltage to the memory device through the first power supply route and supply the second output voltage to the memory device through the third power supply route, when the input voltage is lower than the threshold voltage.

5. The power supply apparatus according to claim 3, wherein the power supply apparatus is configured to:

supply each of a voltage having passed through the first reverse-flow prevention diode and the second output voltage to the memory device through the second power supply route, when the input voltage is higher than or equal to a threshold voltage; and supply each of the first output voltage and the second output voltage to the memory device through the third power supply route, when the input voltage is lower than the threshold voltage.

6. The power supply apparatus according to claim 1, further comprising a voltage detection circuit configured to detect the input voltage, the voltage detection circuit being configured to:

perform control, when the input voltage is higher than or equal to a threshold voltage, to cause a step-up voltage outputted from the step-up circuit to be supplied to each of the first step-down circuit and the capacitor, by setting the switching device to an on-state; and perform control, when the input voltage is lower than the threshold voltage, to cause electric power stored in the capacitor to be supplied to the first step-down circuit, by setting the switching device to an off-state.

7. The power supply apparatus according to claim 1, wherein the second output voltage to be outputted from the second step-down circuit is lower than the first output voltage to be outputted from the first step-down circuit.

8. The power supply apparatus according to claim 1, wherein the power supply apparatus is configured to align a timing of supply of the first output voltage from the first step-down circuit to the memory device and a timing of supply of the second output voltage from the second step-down circuit to the memory device with each other.

9. The power supply apparatus according to claim 1, wherein the memory device comprises a flash memory, a memory controller, or both.

10. A memory system including:

the power supply apparatus according to claim 1; and the memory device.

* * * * *